United States Patent
Bösnecker

(10) Patent No.: US 7,725,277 B2
(45) Date of Patent: May 25, 2010

(54) METHOD AND DEVICE FOR PERFORMING A FREQUENCY ANALYSIS OF AN AC VOLTAGE SIGNAL, IN PARTICULAR ON A POWER GRID

(75) Inventor: Robert Bösnecker, Ergolding (DE)

(73) Assignee: Siemens Aktiengesellschaft, Munich (DE)

( * ) Notice: Subject to any disclaimer, the term of this patent is extended or adjusted under 35 U.S.C. 154(b) by 178 days.

(21) Appl. No.: 11/970,799

(22) Filed: Jan. 8, 2008

(65) Prior Publication Data

US 2009/0125260 A1 May 14, 2009

(30) Foreign Application Priority Data

Nov. 8, 2007 (DE) ........................ 10 2007 054 307

(51) Int. Cl.
*G01R 23/00* (2006.01)
(52) U.S. Cl. .................. 702/75; 324/76.24; 702/67; 702/72; 702/77
(58) Field of Classification Search ............. 702/60–61, 702/64–77, 106; 324/76.24
See application file for complete search history.

(56) References Cited

U.S. PATENT DOCUMENTS 5,406,495 A * 4/1995 Hill .............................. 702/72
5,528,134 A * 6/1996 Davis et al. ............... 324/76.24
5,890,097 A * 3/1999 Cox ............................ 702/67

OTHER PUBLICATIONS

Lichun, L.; Xianci, X. Aligning Harmonics of Signals to DFT Grid, In: IEEE Antennas and Propagation Society International Symposium, Jun. 22-27, 2003, vol. 3, S. 199-202; Others; 2003.

* cited by examiner

*Primary Examiner*—John H Le
(74) *Attorney, Agent, or Firm*—Henry M. Feiereisen; Ursula B. Day

(57) ABSTRACT

In a method for performing a frequency analysis of an AC voltage signal, in particular in a power mains, an upper limit of the period length of a fundamental oscillation in the AC voltage signal is determined. A sequence of sampling values of the AC voltage signal is obtained over a duration longer than the upper limit of the period length, thereby ensuring that more than a period of the fundamental oscillation is sampled. Selected from the sequence of sampling values is a subset of sampling values, with the subset sampling substantially one period of the fundamental oscillation. At least a portion of the sampling values not included in the subset is altered, and a frequency is calculated based on the obtained sequence of sampling values, the subset of sampling values and the altered portion of the sampling values.

16 Claims, 3 Drawing Sheets

METHOD AND DEVICE FOR PERFORMING A FREQUENCY ANALYSIS OF AN AC VOLTAGE SIGNAL, IN PARTICULAR ON A POWER GRID

CROSS-REFERENCES TO RELATED APPLICATIONS

This application claims the priority of German Patent Application, Serial No. 10 2007 054 307.9, filed Nov. 8, 2007, pursuant to 35 U.S.C. 119(a)-(d), the content of which is incorporated herein by reference in its entirety as if fully set forth herein.

BACKGROUND OF THE INVENTION

The present invention relates to a method for performing a frequency analysis of an AC voltage signal, and more particularly an AC voltage signal in a power grid. The present invention also relates to a device for performing the method.

Nothing in the following discussion of the state of the art is to be construed as an admission of prior art.

The AC voltage of power grids has typically a nominal frequency (main frequency). However, the actual frequency frequently deviates from this nominal frequency. For monitoring the AC voltage, devices are used that perform a frequency analysis. In general, these devices use a fast Fourier analysis (fast Fourier transform, FFT). However, in the context of this invention, other transformation methods can also be used, which transform variables in the time domain to variables in the frequency domain, such as the discrete Fourier transformation (DFT) or the Laplace transformation. For a fast Fourier analysis as well as for other transformation methods sampling values must be acquired. To this end, the mains frequency is digitized: a momentarily acting hold circuit (sample-and-hold) freezes the AC voltage signal in periodic intervals, with an analog-digital-converter arranged downstream of the hold circuit for digitizing the input signal. The digitized signal is then supplied to a digital signal processor (DSP) capable of computing the fast Fourier transform and/or scaling and filtering the signal, as well as performing other functions. Current approaches for performing an efficient fast Fourier transform acquire a sequence of sampling values exactly for the duration of a fundamental oscillation of the AC voltage signal. Because the frequency of the AC voltage signal varies, the total sampling duration must also be varied. This is typically preformed concurrently with a readjustment of the frequencies, which requires devices with complex oscillator circuits.

It would therefore be desirable and advantageous to provide a less complex and hence also less expensive device for performing a frequency analysis of an AC voltage signal, such as an AC voltage signal in a power mains, which obviates prior art shortcomings and is able to specifically operate efficiently with fluctuating or changing frequencies of the AC grid.

SUMMARY OF THE INVENTION

According to one aspect of the present invention, a method for forming a frequency analysis of an AC voltage signal, in particular in a power mains, includes the steps of determining an upper limit of the period length of a fundamental oscillation in the AC voltage signal, obtaining a sequence of sampling values of the AC voltage signal over a duration longer than the upper limit of the period length, thereby ensuring that more than a period of the fundamental oscillation is sampled, selecting from the sequence of sampling values a subset of sampling values, with the subset sampling substantially one period of the fundamental oscillation, altering at least a portion of the sampling values not included in the subset, and calculating a frequency based on the obtained sequence of sampling values, the subset of sampling values and the altered portion of the sampling values.

The present invention resolves prior art problems by recognizing that errors can occur in a frequency analysis when the fundamental oscillation is not sampled exactly over one period. The errors can then be reduced and even eliminated by manipulating the sampling values that are not part of a single period of the fundamental oscillation and by then including the manipulated (sampling) values in the analysis. This has the advantage that the duration used for obtaining a sequence of sampling values need no longer be variable, meaning that the corresponding device can be set in advance to a duration slightly longer than a single fundamental oscillation, so as to ensure that at least one sinusoidal oscillation of the AC voltage signal is always included. By obviating the need for adjusting the duration to match the frequency or the corresponding period of a single oscillation, a simple and compact device for carrying out the method can be constructed. This device is therefore more cost-effective than conventional devices which must include an oscillator circuit for adjustment (or tuning).

It is not difficult to identify a period of a fundamental oscillation in the sequence of sampling values. This can be done, on one hand, based on the amplitude, i.e., the magnitude of the sampling value: if an amplitude which is not the full amplitude of the fundamental oscillation repeats a second time, then exactly one period has elapsed (in a sine wave, certain sampling values occur both during an increasing and a decreasing signal). For example, the amplitude "zero" can be defined as amplitude. Similar zero crossings, i.e., zero crossings from a negative to a positive region, on one hand, or from a positive to a negative region, on the other hand, can be used to define the boundary for a period of the fundamental oscillation. Instead of the amplitude, the slope of the sampling values (in simple mathematical terms, the difference to the next sampling value) can be used to define a period of the fundamental oscillation.

The method according to the invention can be applied most easily, if all sampling values which are not included in the subset are changed to a predetermined value. In this way, the error produced in the final frequency analysis by these changed sampling values can be predicted. This can be particularly easily determined when a predetermined value for all sampling values is identical, meaning constant. Preferably, this value can be set to zero to prevent asymmetries. Advantageously, the subset can be defined over a period of the fundamental oscillation that is defined from one zero crossing to the next.

According to another feature of the present invention, an error correction can be performed: the sampling values can be changed and the error resulting from the inclusion of these sampling values (in addition to the sampling values of the subset) in the frequency calculation can be determined, so that this error can then be easily corrected after the frequency has been computed.

The method is particularly suited for frequency analyses using the fast Fourier analysis.

According to another aspect of the present invention, a device for sampling an AC voltage signal for a defined duration is configured to perform a frequency analysis based on sampling values obtained during this duration, and wherein the device, before the frequency analysis, provides a portion of the sampling values for changes to an operator to implement changes, or wherein the device changes the portion automatically A device according to the invention for sampling an AC voltage signal, for example an AC voltage signal in a power mains, is different from conventional devices in that a time duration for sampling the AC voltage signal is fixed, meaning it is not variable. The device according to the invention performs a frequency analysis based on sampling values acquired during this fixed duration. Before the frequency analysis is performed, the device releases a portion of these sampling values to allow changes by an operator (e.g., via a query using a mask). The changes can also be made automatically, for example by defining—as in the afore-described method—a subset of sampling values representing a period of the fundamental oscillation, and by setting the sampling values determined outside this period to a predetermined value, for example zero.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
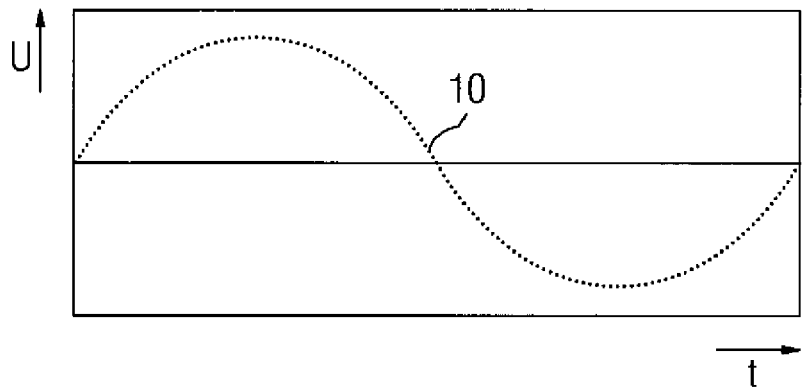
FIG. 1 is a graph showing a sequence of sampling values acquired according to the state of the art.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a sequence 10 of sampling values obtained with conventional devices. To perform a conventional frequency analysis of an AC voltage of a power mains, a current approach is to obtain a sequence of sampling values which cover exactly a single period of the fundamental oscillation. The sampling duration must therefore be adapted to the frequency variations in the AC voltage, which is time-consuming. The diagrams in FIGS. 1 to 3 each show the measured values of the sampling values (i.e., the voltage) on the y-axis as a function of time. Conventionally, sampling is terminated at the end of the fundamental oscillation.

Figure 2:
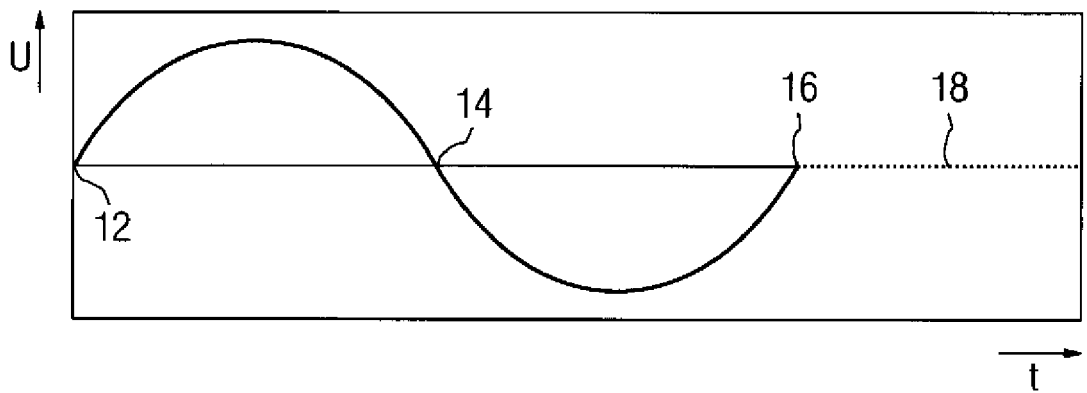
FIG. 2 is a graph showing a sequence of sampling values of a type used by the present invention for a fast Fourier analysis.

According to the invention, the AC voltage signal is sampled over exactly one period of the fundamental oscillation. The overall duration of the sampling is selected so that, when the frequency variations in the AC voltage are taken into account, one complete fundamental oscillation is always sampled and additional sampling values are acquired for a time longer than the period duration. In the example depicted in FIG. 2, sampling starts at a zero crossing of the fundamental oscillation, either fortuitously or through appropriate triggering measures. The zero crossing point is indicated in FIG. 2 with the reference symbol 12. For a subsequent zero crossing 14, the zero crossing 16 thereafter, which is identical to the zero crossing 12, follows exactly after half the period duration, because the zero crossing occurs from negative voltage values to positive voltage values. A full period duration ends with the zero crossing 16. According to the present invention, all sampling values following the second zero crossing 16 are set to a constant value of zero. These sampling values are indicated in FIG. 2 with the reference symbol 18. The sampling values outside the fundamental oscillation which are set to zero have only a minimal effect on the result of a fast Fourier transform. Although this approach has slight disadvantages, the advantage remains that the entire sampling duration is no longer restricted to a period duration of the fundamental oscillation.

Figure 3:
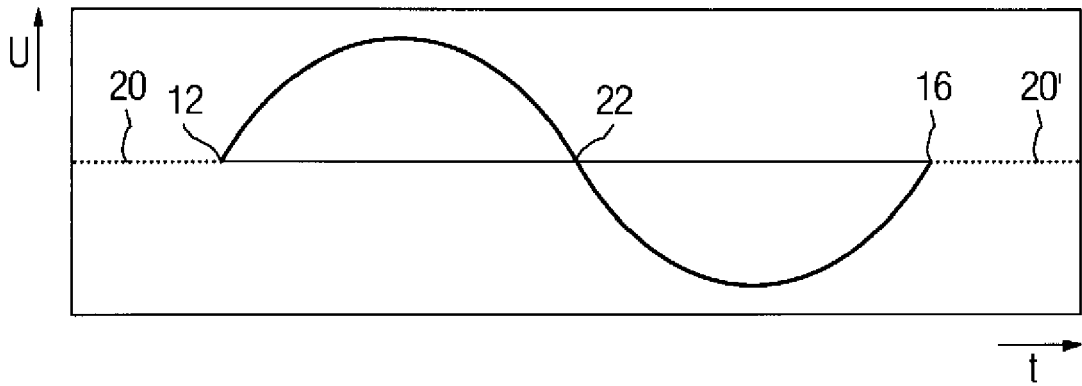
FIG. 3 is a graph showing an alternative sequence of sampling values of a type used by the invention for a fast Fourier analysis.

FIG. 3 shows an embodiment wherein the period starts exactly, either fortuitously or due to suitable triggering, at a zero crossing 12 and ends at a subsequent zero crossing 16. The sequence of sampling values, unlike the sampling values in FIG. 2, does here not begin at the beginning of the sampling interval, but rather in the middle of the sampling interval. Stated differently, the sequence of sampling values, which begins at a zero crossing 12 and ends at a zero crossing 16, is preceded by a sequence of sampling values, and is likewise followed by a sequence of sampling values, which are determined with a method of the invention. Both the preceding and the following sampling values are set to a constant value of zero. These sampling values are indicated with the reference symbols 20 and 20', respectively. The sampling values 20, 20' which were changed to zero introduce only a small but tolerable error in the frequency spectrum; however, the sampling duration advantageously needs no longer be adjusted to match the duration of one period of the fundamental oscillation.

Figure 4:
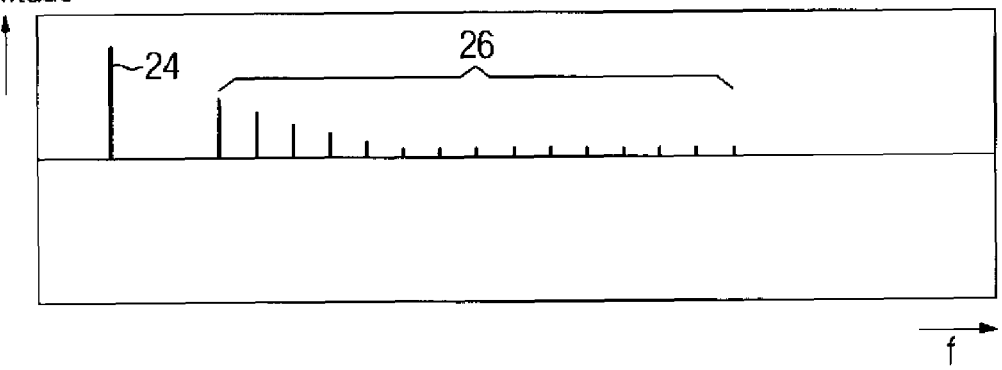
FIG. 4 is a graph showing a spectrum obtained from the sampling values of FIG. 3.
Figure 5:
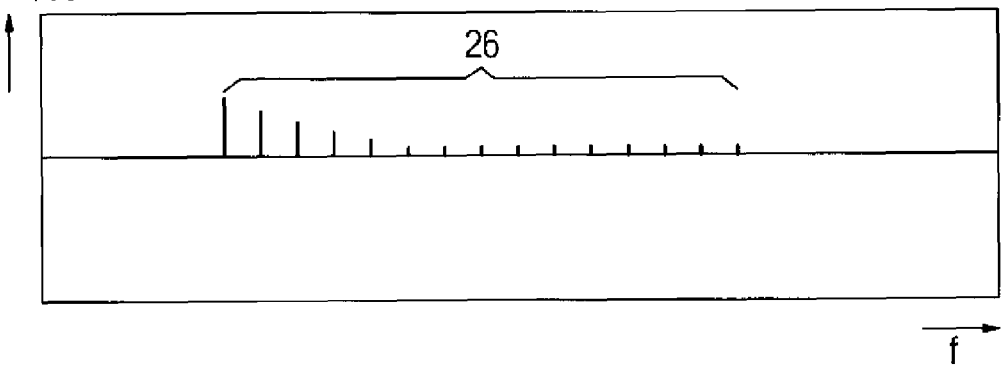
FIG. 5 is a graph showing a partial spectrum of the spectrum depicted in FIG. 4.
Figure 6:
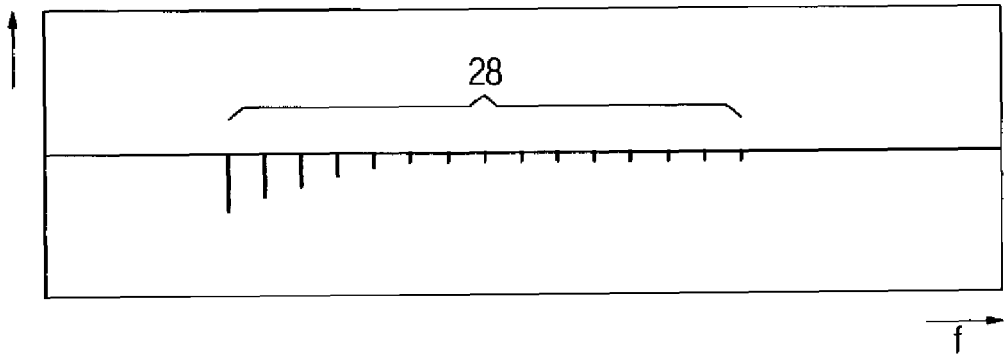
FIG. 6 is a graph showing a spectrum that can be added to the spectrum of FIG. 4 as a correction.

The spectrum depicted in FIG. 4 is obtained by fast Fourier analysis by setting the sampling values 20, 20' to zero: the fundamental oscillation period 22 between the zero crossing 12 and zero crossing 16 results in a peak 24 in the frequency spectrum and was obtained with the values shown in FIG. 3. Setting the values of the sequence 20, 20' to zero causes a number of peaks in the frequency spectrum which are separate from the peak 24. The fundamental oscillation can be unambiguously determined from the peak 24, and the other peaks 26 need not even be considered. The error spectrum shown in FIG. 5 can also be determined based on the discontinuities at the points 12 and 16. A correction spectrum 28 shown in FIG. 6 can be determined from the error spectrum of FIG. 5. The spectral contributions due to the sampling values 20 and 20' which extend beyond a single period and which were changed to zero, can be removed from the spectrum of FIG. 4 by adding the spectrum of FIG. 6.

Figure 7:
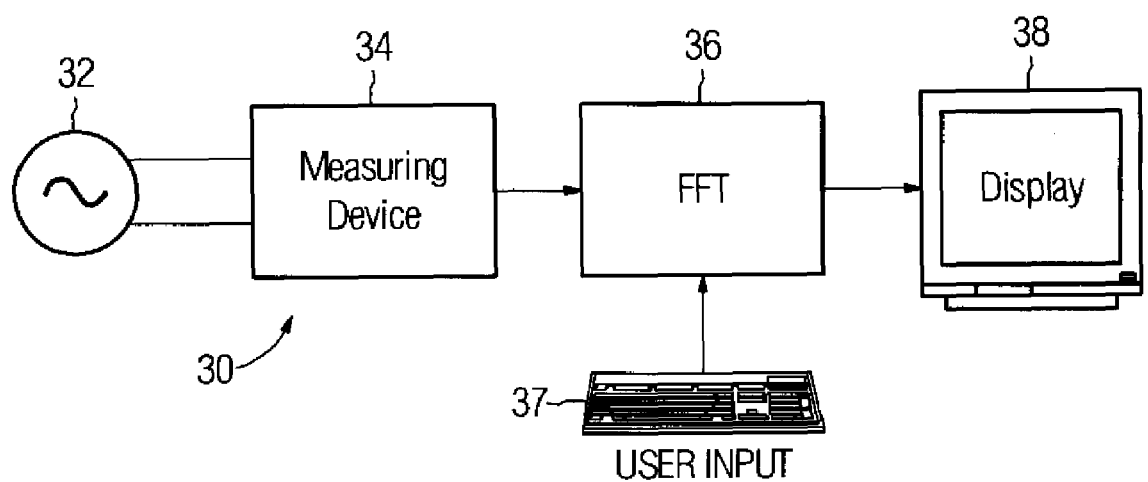
FIG. 7 is a schematic block diagram of a device for carrying out the method according to the present invention.

FIG. 7 depicts schematically in form of a block diagram a device 30 for carrying out the method of the invention. An AC voltage 32, for example, the AC voltage of a power grid, is measured by measuring device 34 which measures a timedependence of the AC voltage 32. The time-dependent signal is supplied to a device 36 adapted to transform the time-dependent signal into the frequency domain, in the depicted example by a fast Fourier transform (FFT). The device 36 also selects and computes the sampling values used with the method of the invention. The resulting spectrum in the frequency domain can then be displayed on monitor 38. Before the frequency analysis, a portion of the sampling values can be changed by user input, for example, via input device 37. Alternatively, the device changes the portion of the sampling values automatically.

In summary, the following method is carried out: the overall sampling duration is selected so that a complete sine wave of the AC voltage signal to be analyzed can be acquired and stored in a corresponding digital memory. A partial sequence (subset) of the sampling values is then selected, in the present example between the zero crossings 12 and 16, and the sampling values acquired outside this subset (i.e., before and afterwards) are changed to zero (sequence of values 18 in FIG. 2, and 20 and 20' in FIG. 3). In this way, all values, i.e., the values of the period of the fundamental oscillation and the values changed to zero, can be used with a fast Fourier transformation or another transformation method, such as a Laplace transformation. The applied error correction has the same effect as if the sampling duration would extend exactly over the duration of a single period of the fundamental oscillation.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

What is claimed is:

1. A method for calculating a frequency of an AC voltage signal using a conversion device, in particular in a power mains, comprising the steps of:
   determining an upper limit of the period length of a fundamental oscillation in the AC voltage signal,
   obtaining a sequence of sampling values of the AC voltage signal over a duration longer than the upper limit of the period length, thereby ensuring that more than a period of the fundamental oscillation is sampled,
   selecting from the sequence of sampling values a subset of sampling values, with the subset sampling substantially one period of the fundamental oscillation,
   altering at least a portion of the sampling values not included in the subset, and
   calculating the frequency based on the obtained sequence of sampling values, the subset of sampling values and the altered portion of the sampling values.

2. The method of claim 1, wherein in the selecting step, if two sampling values having a substantially identical amplitude, all sampling values between the two sampling values are selected for the subset.

3. The method of claim 1, wherein in the selecting step, if two adjacent sampling values have a substantially identical slope, all sampling values between the two sampling values are selected for the subset.

4. The method according to claim 1, wherein in the altering step, all sampling values not included in the subset are changed to a predetermined value.

5. The method of claim 4, wherein the predetermined value is identical for all sampling values.

6. The method of claim 5, wherein the predetermined value is equal to zero.

7. The method of claim 1, wherein in the altering step, the sampling values are altered such that it can be determined which error results from these sampling values, wherein these sampling values are included in a frequency calculation, and wherein this error is corrected after the frequency calculation.

8. The method of claim 1, wherein calculating the frequency includes performing a fast Fourier analysis (FFT).

9. A device for performing a frequency analysis of an AC voltage signal, comprising:
   a measuring device receiving the AC voltage signal and sampling the AC voltage signal in a time domain,
   a conversion device which receives the sampled AC voltage signal and is configured to determine an upper limit of the period length of a fundamental oscillation in the AC voltage signal, obtain a sequence of sampling values of the AC voltage signal over a duration longer than the upper limit of the period length, thereby ensuring that more than a period of the fundamental oscillation is sampled, select from the sequence of sampling values a subset of sampling values, with the subset sampling substantially one period of the fundamental oscillation, alter at least a portion of the sampling values not included in the subset, and calculate a frequency based on the obtained sequence of sampling values, the subset of sampling values and the altered portion of the sampling values; and
   a display device for displaying the calculated frequency.

10. The device of claim 9, wherein the conversion device selects for the subset, if two sampling values having a substantially identical amplitude, all sampling values between the two sampling values.

11. The device of claim 9, wherein the conversion device selects for the subset, if two adjacent sampling values have a substantially identical slope, all sampling values between the two sampling values.

12. The device according to claim 9, wherein the conversion device alters all sampling values not included in the subset to a predetermined value.

13. The device of claim 12, wherein the predetermined value is identical for all sampling values.

14. The device of claim 13, wherein the predetermined value is equal to zero.

15. The device of claim 9, wherein the conversion device alters the sampling values so as to determine which error results from these sampling values, includes the altered sampling values in a frequency calculation, and corrects this error after the frequency calculation.

16. The device of claim 9, wherein the conversion device calculates the frequency by performing a fast Fourier analysis (FFT).

* * * * *